(12) United States Patent
Jeon (10) Patent No.: US 9,030,618 B2
(45) Date of Patent: May 12, 2015

(54) FLEXIBLE DISPLAY PANEL

(71) Applicant: Samsung Display Co., Ltd., Yongin, Gyeonggi-Do (KR)

(72) Inventor: Mu-Kyung Jeon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/797,135

(22) Filed: Mar. 12, 2013

(65) Prior Publication Data

US 2014/0097440 A1   Apr. 10, 2014

(30) Foreign Application Priority Data

Oct. 5, 2012   (KR) .................. 10-2012-0110692

(51) Int. Cl.
*G09G 3/30* (2006.01)
*H01L 27/12* (2006.01)
*H01L 51/00* (2006.01)
*H01L 27/32* (2006.01)

(52) U.S. Cl.
CPC ........ *H01L 27/1251* (2013.01); *H01L 51/0097* (2013.01); *H01L 27/3262* (2013.01); *H01L 2251/5338* (2013.01)

(58) Field of Classification Search
CPC .................................................... G09G 3/3233
USPC .................. 257/E27.06; 313/511; 315/169.3; 349/43
See application file for complete search history.

(56) References Cited

U.S. PATENT DOCUMENTS

| 7,091,936 | B1 | 8/2006 | Yamada | |
|---|---|---|---|---|
| 7,669,319 | B2 | 3/2010 | Seo et al. | |
| 2004/0159845 | A1 | 8/2004 | Matsumoto | |
| 2006/0244355 | A1 | 11/2006 | Park et al. | |
| 2007/0229417 | A1 | 10/2007 | Giraldo et al. | |
| 2008/0225191 | A1* | 9/2008 | Ohara et al. | 349/39 |
| 2009/0149249 | A1* | 6/2009 | Sum | 463/30 |
| 2009/0256991 | A1 | 10/2009 | Shinn et al. | |
| 2012/0062447 | A1 | 3/2012 | Tseng et al. | |
| 2012/0204453 | A1 | 8/2012 | Jung | |

FOREIGN PATENT DOCUMENTS

| JP | 2001109399 | 4/2001 |
|---|---|---|
| JP | 4128045 | 5/2008 |
| JP | 2010097052 | 4/2010 |
| KR | 1020120092313 | 8/2012 |

* cited by examiner

*Primary Examiner* — Thomas L Dickey
(74) *Attorney, Agent, or Firm* — Robert E. Bushnell, Esq.

(57) ABSTRACT

A flexible display panel includes a first display region that is flat, second display regions located at both sides of the first display region and curved by a predetermined angle, a plurality of pixels formed in the first display region, and a plurality of pixels formed in the second display regions, Each of the plurality of pixels formed in the first display region and the second display regions includes a light-emitting diode and a driving thin-film transistor (TFT) connected to the light-emitting diode, the driving TFT supplying a driving current to the light-emitting diode. A size of the driving TFT varies for each of the plurality of pixels formed in the second display regions so that driving currents supplied by driving TFTs in the second display regions vary in one direction with respect to boundaries between the first display region and the second display regions.

20 Claims, 9 Drawing Sheets

FIG. 10

# FLEXIBLE DISPLAY PANEL

CLAIM OF PRIORITY

This application makes reference to, incorporates the same herein, and claims all benefits accruing under 35 U.S.C. §119 from an application earlier filed in the Korean Intellectual Property Office on the 5 Oct. 2012 and there duly assigned Ser. No. 10-2012-0110692.

BACKGROUND OF THE INVENTION

1. Field of the Invention

The present invention relates to a flexible display panel, and more particularly to a flexible display panel having a pixel structure capable of solving non-uniformity of image characteristics which is incurred by flexion of the flexible display panel.

2. Description of the Related Art

Recently, flexible display devices have been highlighted as new devices in the display field. The flexible display devices are embodied on a thin and flexible substrate formed of plastic or the like, so that the flexible display devices can be folded or rolled like paper, without damage. Currently, flexible display devices are embodied by using a liquid crystal display (LCD) device, an organic light-emitting display device or the like which include a thin-film transistor (TFT).

SUMMARY OF THE INVENTION

The present invention provides a flexible display panel having a pixel structure capable of solving non-uniformity of image characteristics which is incurred by flexion of the flexible display panel.

According to an aspect of the present invention, there is provided a flexible display panel including a first display region that is flat, second display regions located at both sides of the first display region and curved by a predetermined angle, a plurality of pixels formed in the first display region, and a plurality of pixels formed in the second display regions. Each of the plurality of pixels formed in the first display region and the second display region includes a driving thin-film transistor (TFTs) connected to a light-emitting diode, the driving TFT supplying a driving current to the light-emitting diode. A size of the driving TFT varies for each of the plurality of pixels formed in at least a part of the second display regions, such that driving currents supplied by driving TFTs in the second display regions vary in one direction with respect to boundaries between the first display region and the second display regions.

The size of the driving TFT may vary with the length of a channel region in which a driving gate electrode and a driving semiconductor layer overlap with each other by adjusting a length of the driving gate electrode.

Sizes of driving TFTs of pixels that are formed in a first direction may be gradually decreased so that brightness is increased in the first direction in which a visual distance and a viewing angle are increased with respect to the boundaries between the first display region and each of the second display regions.

Sizes of driving TFTs of pixels that are formed in a first direction may be gradually increased so that brightness is decreased in the first direction in which a visual distance and a viewing angle are increased with respect to the boundaries between the first display region and each of the second display regions.

Sizes of driving TFTs of one or more color pixels related to a color and formed in a first direction may be gradually increased so that brightness of the color is decreased in the first direction, increasing a display ratio of the color with respect to the boundaries between the first display region and each of the second display regions. Here, sizes of driving TFTs of color pixels in the first display region may be equal to each other. The color pixels may include a red pixel, a green pixel, and a blue pixel.

The driving TFT may include: a driving semiconductor layer; a driving gate electrode formed on a first insulating layer on the driving semiconductor layer and a second insulating layer on a first electrode of a storage capacitor formed on the first insulating layer, and the driving gate electrode covers a channel region of the driving semiconductor layer; and a driving source electrode and a driving drain electrode that correspond to a driving source region and a driving drain region, respectively, of the driving semiconductor layer. The driving source electrode and the driving drain electrode are doped with impurity.

The second display regions may be flexed toward a first side on which an image is realized.

The second display regions may be flexed toward a second side opposite to a first side on which an image is realized.

According to another aspect of the present invention, there is provided a flexible display panel including: a first display region that is flat and in which a first plurality of pixels, each including a light-emitting diode and a first driving thin-film transistor (TFT), are formed, the first driving TFT being connected to and supplying a driving current to the light-emitting diode; and second display regions curved at both sides of the first display region by a predetermined angle, in which a second plurality of pixels, each including a light-emitting diode and a second driving TFT, are formed. For each of the second plurality of pixels formed in the second display regions, the second driving TFT is connected to and supplies a driving current to the light-emitting diode. The second plurality of pixels are formed in predetermined regions of each of the second display regions, and for each of the second plurality of pixels further formed in the predetermined regions, a size of the second driving TFT varies in response to brightness changes in the predetermined regions with respect to boundaries with the first display region.

The size of the second driving TFT may vary by adjusting a length of a channel region in which a driving gate electrode and a driving semiconductor layer overlap with each other, by adjusting a length of the driving gate electrode.

Sizes of a plurality of the second driving TFTs of pixels that are formed in a first direction may be gradually decreased so that brightness is increased in the first direction, increasing a visual distance and a viewing angle in the predetermined region.

Sizes of a plurality of the second driving TFTs of pixels that are formed in a first direction may be gradually increased so that brightness is decreased in the first direction, increasing a visual distance and a viewing angle in the predetermined region.

According to another aspect of the present invention, there is provided a flexible display panel including: a first display region that is flat and in which a first plurality of pixels, each including a light-emitting diode and a first driving thin-film transistor (TFT), are formed, the first driving TFT being connected to and supplying a driving current to the light-emitting diode; and second display regions, curved at both sides of the first display region by a predetermined angle and in which a second plurality of pixels, each including a light-emitting diode and a second driving TFT, are formed. For each of the second plurality of pixels formed in the second display regions, the second driving TFT is connected to and supplies a driving current to the light-emitting diode. For colored pixels formed in predetermined regions of each of the second display regions, second driving TFT size varies in response to a color impression change in the predetermined regions with respect to boundaries with the first display region.

The size of the second driving TFT may vary with a length of a channel region in which a driving gate electrode and a driving semiconductor layer overlap with each other, by adjusting a length of the driving gate electrode.

Sizes of a plurality of the second driving TFTs of one or more color pixels related to a particular color and formed in a first direction may be gradually increased so that brightness of the particular color is decreased in the first direction, increasing a display ratio of the particular color in the predetermined region.

Sizes of first driving TFTs of different color pixels formed in the first display region may be equal to each other.

The color pixels may include a red pixel, a green pixel, and a blue pixel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

In the description of the present invention, certain detailed explanations of related art are omitted when it is deemed that they may unnecessarily obscure the essence of the invention.

In the drawings, like reference numerals in the drawings denote like elements, and the size of each component may be exaggerated for clarity.

In the drawings, the thicknesses of layers and regions of components may be exaggerated for clarity. It will also be understood that, when a layer is referred to as being "on" another layer or a substrate, it can be directly on the other layer or the substrate, or intervening layers may also be present therebetween.

Also, when a part "includes" or "comprises" an element, unless there is a particular description contrary thereto, the part can further include other elements, not excluding the other elements. Throughout the specification, when an element is referred to as being "on" another element, it means that the element is on or below the other element and does not mean that the element is necessarily on the other element in a gravity direction.

As used herein, the term "and/or" includes any and all combinations of one or more of the associated listed items.

Expressions such as "at least one of," when preceding a list of elements, modify the entire list of elements and do not modify the individual elements of the list.

Figure 1A:
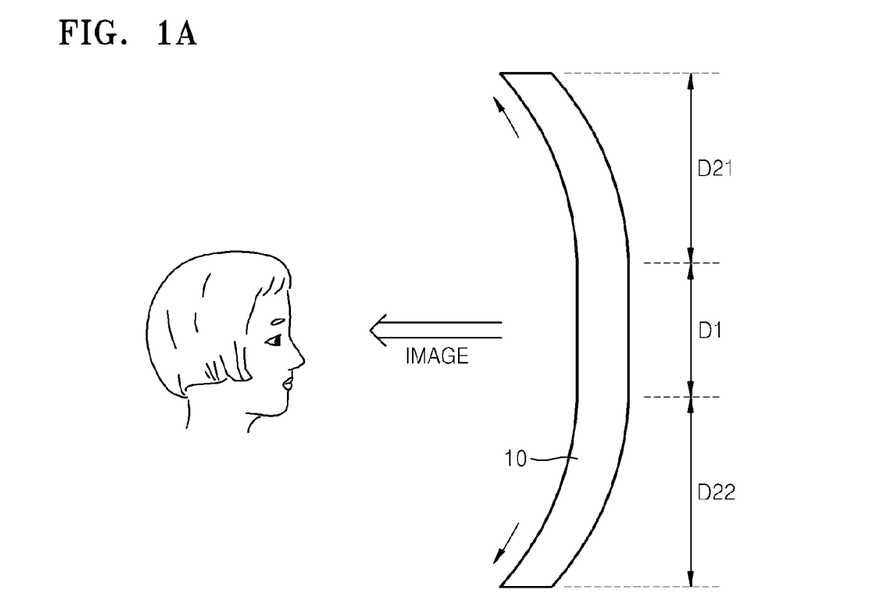
FIGS. 1A and 1B are side views illustrating a flexible display panel according to an embodiment of the present invention.
Figure 1B:
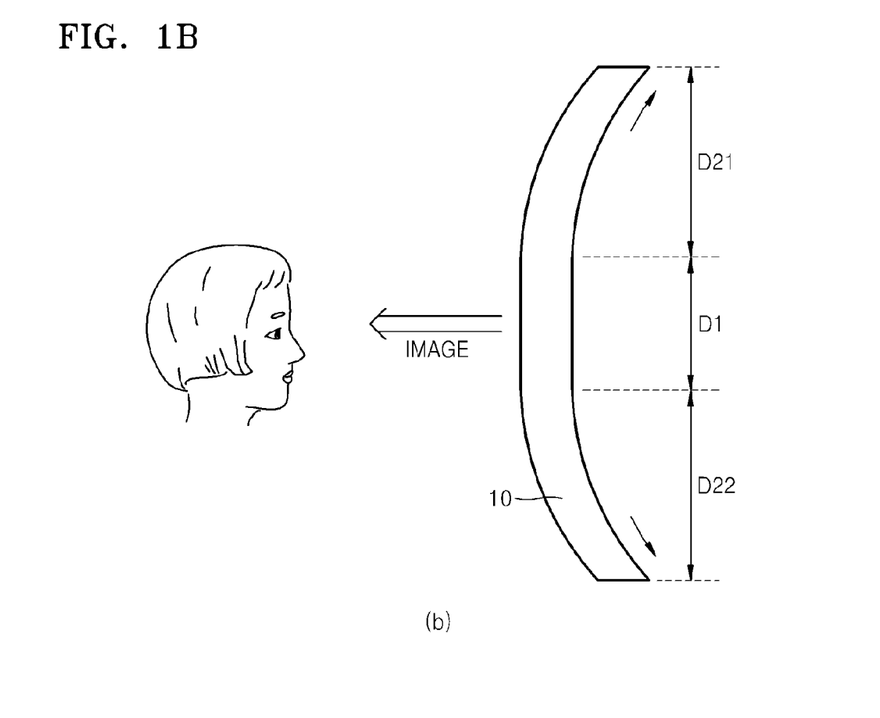

FIGS. 1A and 1B are side views illustrating a flexible display panel according to an embodiment of the present invention.

Referring to FIGS. 1A and 1B, the flexible display panel 10 has a first display region D1 and second display regions D21 and D22 that extend upwardly and downwardly from the first display region D1.

The first display region D1 is substantially flat. The second display regions D21 and D22 are flexed by a predetermined angle at a boundary with the first display region D1. As illustrated in FIG. 1A, the second display regions D21 and D22 may be flexed toward a front surface on which an image is realized, so that the second display regions D21 and D22 may have curved surfaces. Alternatively, as illustrated in FIG. 1B, the second display regions D21 and D22 may be flexed in an opposite direction with respect to the front surface on which an image is realized, so that the second display regions D21 and D22 may have curved surfaces.

As in a general flat panel, if an optical characteristic is uniformly expressed on an entire surface of the flexible display panel 10, when the flexible display panel 10 is viewed by a person, image characteristics such as brightness, color impression, and the like are not uniformly expressed at different positions due to a dark shadow, a perspective, refraction at a main view angle, or the like. For example, according to a flexion level of the flexible display panel 10, brightness of the second display regions D21 and D22 is higher or lower than brightness of the first display region D1, and in this regard, a brightness difference also occurs within each of second display regions D21 and D22 having the curved surfaces. Depending on the flexion level of the flexible display panel 10, a ratio of a particular color (a color impression) in the second display regions D21 and D22 is higher or lower than that of the first display region D1, and the color impression difference also occurs within each of the second display regions D21 and D22.

In the present embodiment, a size of a driving thin-film transistor (TFT) varies in color pixels formed in a predetermined region of the second display regions D21 and D22, so as to correspond to a brightness change and/or a color impression change occurring in the predetermined region with respect to the boundaries between the first display region D1 and the second display regions D21 and D22. For example, brightness and/or color impression gradually increase or decrease from the boundaries to an outer side or vice versa. In order to achieve uniformity in brightness and/or color impression, the size of the driving TFT that is connected to and supplies a driving current to light-emitting devices may be varied for pixels formed in the second display regions D21 and D22. Depending on the size of the driving TFT, a driving current that flows in the light-emitting devices varies and brightness of the pixels may be adjusted accordingly to achieve uniformity in brightness and/or color impression of the flexible display panel 10.

Figure 2:
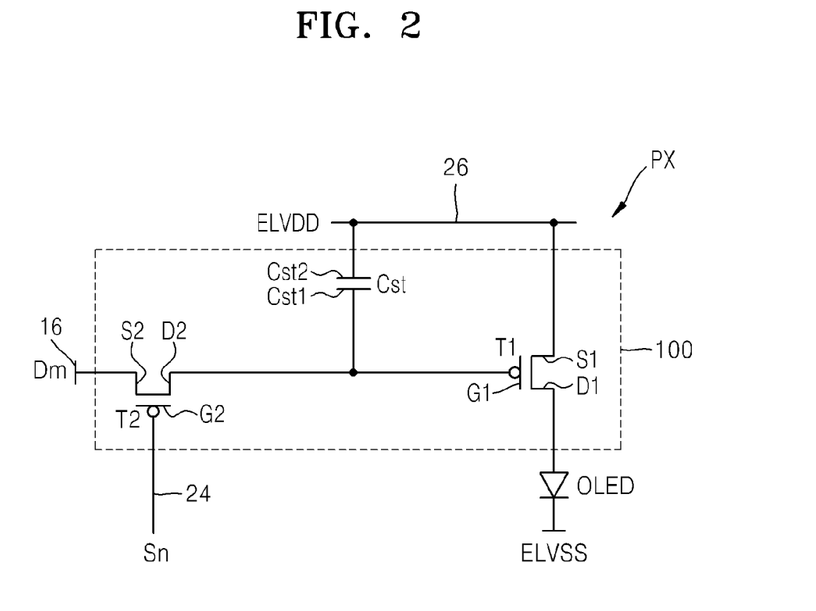
FIG. 2 is a circuit diagram of a pixel according to an embodiment of the present invention.
Figure 3:
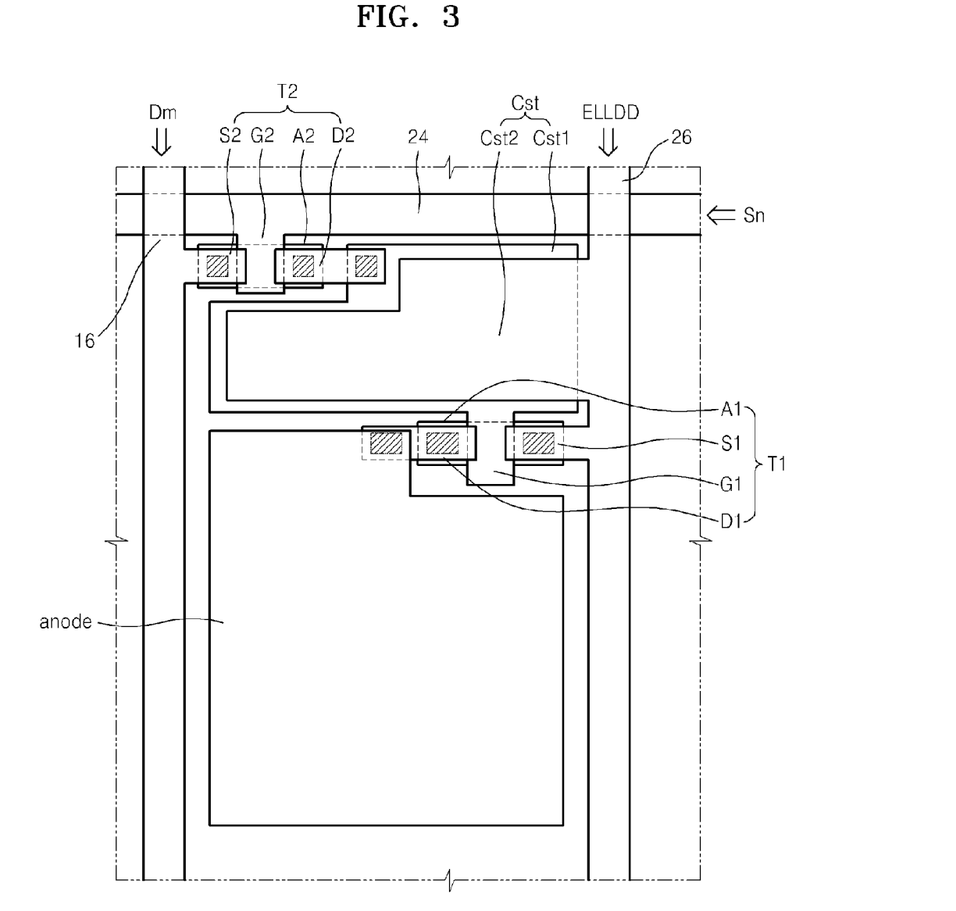
FIG. 3 is a planar view of the pixel of FIG. 2.

FIG. 2 is a circuit diagram of a pixel, according to an embodiment of the present invention, and FIG. 3 is a planar view of the pixel of FIG. 2.

The flexible display panel 10 includes a first substrate having a plurality of pixels PX formed thereon, and a second substrate facing the first substrate. Referring to FIGS. 2 and 3, each of the plurality of pixels PX formed on the first substrate may include two TFTs and one capacitor.

Each pixel PX includes an organic light-emitting diode OLED that is connected between a first power ELVDD and a second power ELVSS, and a pixel circuit 100 that is connected between the first power ELVDD and the organic light-emitting diode OLED. The pixel circuit 100 controls a driving power supplied to the organic light-emitting diode OLED.

An anode electrode of the organic light-emitting diode OLED is connected to the first power ELVDD via the pixel circuit 100, and a cathode electrode of the organic light-emitting diode OLED is connected to the second power ELVSS. When a driving power is supplied from the first power ELVDD to the organic light-emitting diode OLED via the pixel circuit 100, and a common power is supplied from the second power ELVSS to the organic light-emitting diode OLED, the organic light-emitting diode OLED emits a brightness corresponding to a driving current flowing through it.

The pixel circuit 100 includes a driving TFT T1, a switching TFT T2, and a storage capacitor Cst.

The driving TFT T1 is connected between the first power ELVDD and the anode electrode of the organic light-emitting diode OLED. Each pixel PX emits in response to a voltage stored in the storage capacitor Cst, wherein the driving TFT T1 controls current flow from the first power ELVDD to the second power ELVSS via the organic light-emitting diode OLED. A driving gate electrode G1 of the driving TFT T1 is connected to a first terminal Cst1 of the storage capacitor Cst, and a driving source electrode S1 is connected to both a second terminal Cst2 of the storage capacitor Cst and a driving voltage line 26 to which the first power ELVDD is applied. A driving drain electrode D1 of the driving TFT T1 is connected to the anode electrode of the organic light-emitting diode OLED. The organic light-emitting diode OLED emits light in response to an amount of current supplied from the driving TFT T1.

The switching TFT T2 is connected between a data line 16 and the driving TFT T1 and is turned on when a scan signal Sn is supplied from a scan line 24, thus supplying a data signal Dm from the data line 16 to the storage capacitor Cst. The storage capacitor Cst charges a voltage corresponding to the data signal Dm. That is, a switching gate electrode G2 of the switching TFT T2 is connected to the scan line 24, and a switching source electrode S2 is connected to the data line 16. Switching drain electrode D2 of the switching TFT T2 is connected to the first terminal Cst1 of the storage capacitor Cst.

Figure 4:
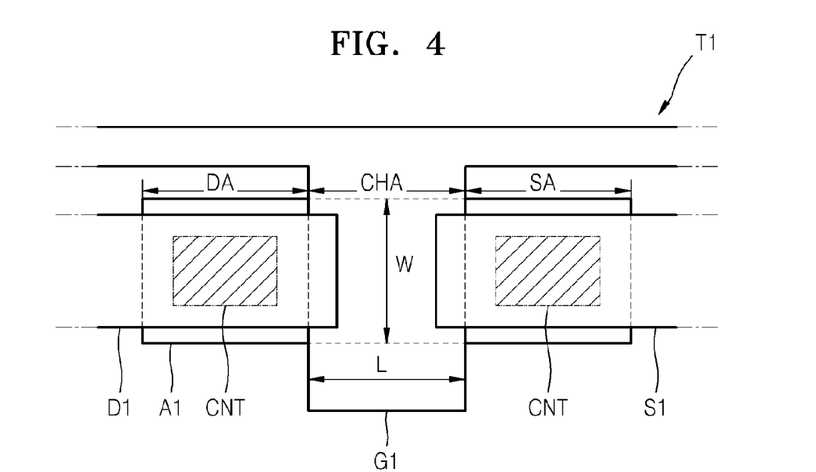
FIG. 4 illustrates a portion of a driving thin-film transistor (TFT) of FIGS. 2 and 3.

FIG. 4 illustrates a portion of a driving thin-film transistor (TFT) T1 of FIGS. 2 and 3.

Referring to FIG. 4, the driving TFT T1 includes a driving semiconductor layer A1, the driving gate electrode G1, the driving source electrode S1, and the driving drain electrode D1.

The driving semiconductor layer A1 may be formed of polysilicon and may include a source region SA and a drain region DA which are both doped with a doping material, and a channel region CHA between the source region SA and the drain region DA.

A gate insulating layer is formed between the driving semiconductor layer A1 and the driving gate electrode G1. The channel region CHA, in which the driving semiconductor layer A1 overlaps the driving gate electrode G1, defines a channel length L and a channel width W of the driving TFT T1. A size of the driving TFT T1 is given by the channel length L and the channel width W. As the channel length L or the channel width W increases, the size of the driving TFT T1 increases.

The driving source electrode S1 and the driving drain electrode D1 are connected to the source region SA and the drain region DA, respectively, via contact holes CNT.

Brightness of a pixel is proportional to a driving current Ioled that flows in the organic light-emitting diode OLED, and the driving current Ioled is proportional to the channel length L and the channel width W of the driving TFT T1, as shown in Equation 1 below.

$$Ioled = \frac{1}{2} \cdot \mu \cdot C_{ox} \cdot \frac{W}{L}(Vgs - Vth)^2 \quad \text{Equation 1}$$
$$= \frac{1}{2} \cdot \mu \cdot C_{ox} \cdot \frac{W}{L}(Vdd - Vdata - Vth)^2$$

Here, 'μ' indicates mobility of the driving TFT T1, 'Cox' indicates a parasitic capacity of the driving TFT T1, 'W' indicates the channel width of the driving TFT T1, 'L' indicates the channel length of the driving TFT T1, 'Vgs' indicates a difference between a voltage of the driving gate electrode G1 and a voltage of the driving source electrode S1, 'Vth' indicates a threshold voltage of the driving TFT T1, 'Vdd' indicates a voltage of the first power ELVDD, and 'Vdata' indicates a voltage of the data signal Dm.

As shown in Equation 1, if the channel width W of the driving TFT T1 is constant and the channel length L is increased, the driving current Ioled flowing in the organic light-emitting diode OLED is decreased, thus decreasing brightness of the light emitted from the organic light-emitting diode OLED. On the other hand, if the channel width W of the driving TFT T1 is constant and the channel length L is decreased, the driving current Ioled flowing in the organic light-emitting diode OLED is increased, thus increasing the brightness of the light emitted from the organic light-emitting diode OLED.

Therefore, in the present embodiment, the brightness is controlled by adjusting the channel length L, provided that the channel width W of the driving TFT T1 is constant, so that non-uniformity of image characteristics incurred by flexion of the flexible display panel 10 is resolved.

Figure 5:
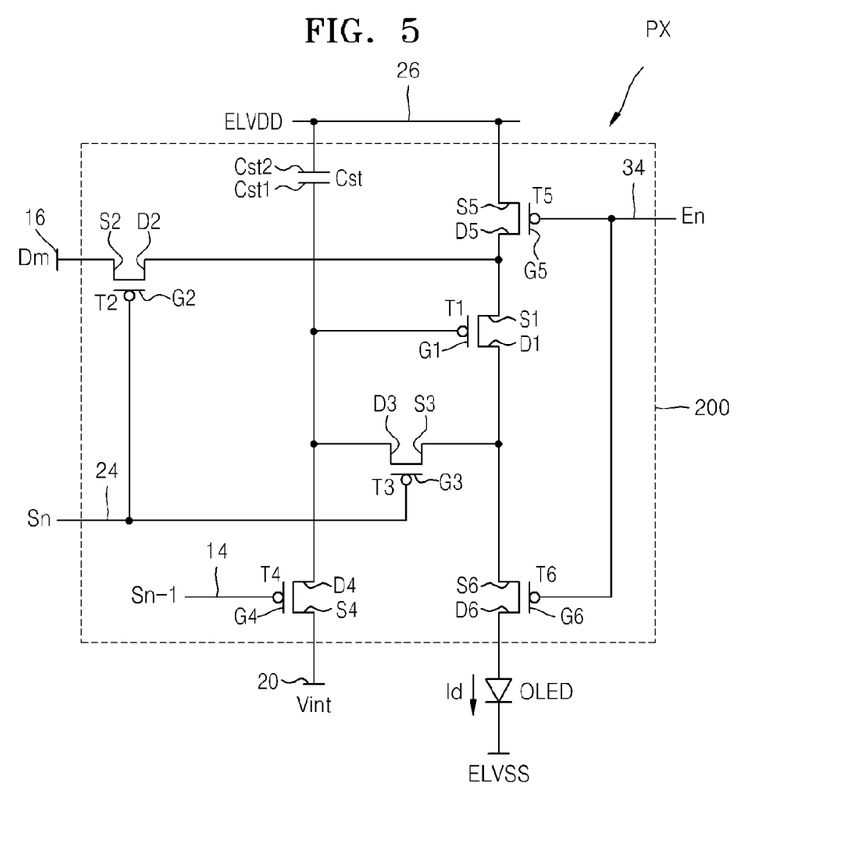
FIG. 5 is a circuit diagram of a pixel according to an embodiment of the present invention.
Figure 6:
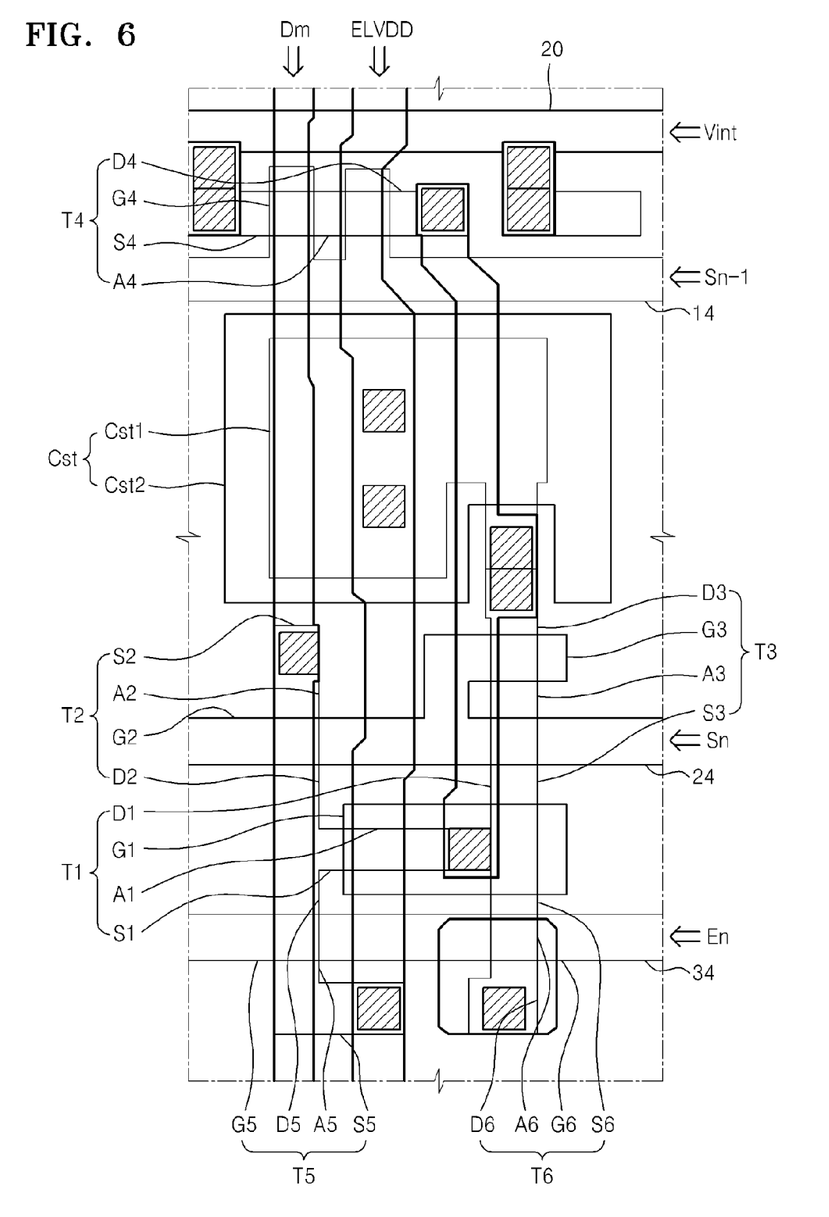
FIG. 6 is a cross-sectional view illustrating a pixel circuit of FIG. 5.

FIG. 5 is a circuit diagram of a pixel according to an embodiment of the present invention, and FIG. 6 is a cross-sectional view illustrating a pixel circuit of FIG. 5.

Referring to FIGS. 5 and 6, the pixel PX of the flexible display panel 10 according to the present embodiment may include six TFTs T1 thru T6, and one capacitor.

The pixel PX includes the pixel circuit 200 including the TFTs T1 thru T6 and a storage capacitor Cst. The pixel PX further includes an organic light-emitting diode OLED that emits light upon receiving a driving voltage via the pixel circuit 200.

The pixel PX includes a scan line 24 for transferring a scan signal Sn, a previous scan line 14 for transferring a previous scan signal Sn-1 to an initialization TFT T4, an emission control line 34 for transferring an emission control signal En to both an operation control TFT T5 and an emission control TFT T6, a data line 16 that crosses but does not connect to the scan line 24, the data line 16 transferring a data signal Dm, a driving voltage line 26 being almost parallel to the data line 16, the driving voltage line 26 transferring a first power ELVDD, and an initialization voltage line 20 for transferring an initialization voltage Vint to a driving TFT T1.

The TFTs T1 thru T6 include the driving TFT T1, a switching TFT T2, a compensation TFT T3, the initialization TFT T4, the operation control TFT T5, and the emission control TFT T6.

The driving TFT T1, the switching TFT T2, the compensation TFT T3, the initialization TFT T4, the operation control TFT T5, and the emission control TFT T6 are formed along a semiconductor layer. The semiconductor layer is formed of polysilicon and includes a channel region, a source region and a drain region. The channel region is not doped with impurity and the source and drain regions are formed in both sides of the channel region by being doped with impurity. The impurity may be an n-type impurity or p-type impurity according to transistor type. The semiconductor layer includes a driving semiconductor layer (not shown) formed in the driving TFT T1, a switching semiconductor layer (not shown) formed in the switching TFT T2, a compensation semiconductor layer (not shown) formed in the compensation TFT T3, an initialization semiconductor layer (not shown) formed in the initialization TFT T4, an operation control semiconductor layer (not shown) formed in the operation control TFT T5, and an emission control semiconductor layer (not shown) formed in the emission control TFT T6.

The driving TFT T1 includes a driving semiconductor layer A1, a driving gate electrode G1, a driving source electrode S1, and a driving drain electrode D1. The driving gate electrode G1 of the driving TFT T1 is connected to a first terminal Cst1 of the storage capacitor Cst, the driving source electrode S1 of the driving TFT T1 is connected to the driving voltage line 26 via the operation control TFT T5, and the driving drain electrode D1 of the driving TFT T1 is electrically connected to an anode electrode of the organic light-emitting diode OLED via the emission control TFT T6. The driving TFT T1 receives the data signal Dm in response to a switching operation of the switching TFT T2, and then supplies a driving current Id to the organic light-emitting diode OLED. Although not illustrated, the driving gate electrode G1 covers a channel region of the driving semiconductor layer A1, and both a first insulating layer and a second insulating layer on the first insulating layer are formed between the driving semiconductor layer A1 and the driving gate electrode G1. The driving gate electrode G1 is connected to the first terminal Cst1 of the storage capacitor Cst by using a connection member via a contact hole. The first terminal Cst1 of the storage capacitor Cst is formed on the first insulating layer. The driving source electrode S1 corresponds to a driving source region of the driving semiconductor layer A1, and the driving drain electrode D1 corresponds to a driving drain region of the driving semiconductor layer A1. The driving source region of the driving semiconductor layer A1 and the driving drain region of the driving semiconductor A1 are both doped with impurity.

The switching TFT T2 includes a switching semiconductor layer A2, a switching gate electrode G2, a switching source electrode S2, and a switching drain electrode D2. The switching gate electrode G2 of the switching TFT T2 is connected to the scan line 24, the switching source electrode S2 of the switching TFT T2 is connected to the data line 16, and the switching drain electrode D2 of the switching TFT T2 is connected to both the driving source electrode S1 of the driving TFT T1 and the driving voltage line 26 via the operation control TFT T5. The switching TFT T2, when turned on in response to the scan signal Sn transferred via the scan line 24, performs the switching operation for transferring the data signal Dm from the data line 16 to the driving source electrode S1 of the driving TFT T1. The switching source electrode S2 corresponds to a switching source region of the switching semiconductor layer A2, and the switching drain electrode D2 corresponds to a switching drain region of the switching semiconductor layer A2. The switching source region and the switching drain region of the switching semiconductor A2 are both doped with impurity.

The compensation TFT T3 includes a compensation semiconductor layer A3, a compensation gate electrode G3, a compensation source electrode S3, and a compensation drain electrode D3. The compensation gate electrode G3 of the compensation TFT T3 is connected to the scan line 24, and the compensation source electrode S3 is connected to the driving drain electrode D1 of the driving TFT T1 and additionally to the anode electrode of the organic light-emitting diode OLED via the emission control TFT T6. Compensation drain electrode D3 is connected to the first terminal Cst1 of the storage capacitor Cst, an initialization drain electrode D4 of the initialization TFT T4, and the driving gate electrode G1 of the driving TFT T1. When the compensation TFT T3 is turned on in response to the scan signal Sn transferred via the scan line 24, the compensation TFT T3 connects the driving gate electrode G1 and the driving drain electrode D1 of the driving TFT T1 to diode-connected. The compensation TFT T3 forms a dual gate electrode, thereby preventing a leakage current. The compensation source electrode S3 corresponds to a compensation source region of the compensation semiconductor layer A3, and the compensation drain electrode D3 corresponds to a compensation drain region of the compensation semiconductor layer A3. The compensation source region and the compensation drain region of the compensation semiconductor layer A3 are doped with impurity.

The initialization TFT T4 includes an initialization semiconductor layer A4, an initialization gate electrode G4, an initialization source electrode S4, and an initialization drain electrode D4. The initialization gate electrode G4 of the initialization TFT T4 is connected to the previous scan line 14, the initialization source electrode S4 is connected to the initialization voltage line 20, and the initialization drain electrode D4 is connected with the first terminal Cst1 of the storage capacitor Cst, the compensation drain electrode D3 of the compensation TFT T3, and the driving gate electrode G1 of the driving TFT T1. The initialization TFT T4 is turned on in response to the scan signal Sn-1 transferred via the scan line 14, and then transfers the initialization voltage Vint to the driving gate electrode G1 of the driving TFT T1, thus initializing a voltage of the driving gate electrode G1 of the driving TFT T1. The initialization gate electrode G4 is a dual gate electrode.

The operation control TFT T5 includes an operation control semiconductor layer A5, an operation control gate electrode G5, an operation control source electrode S5, and an operation control drain electrode D5. The operation control gate electrode G5 is connected to the emission control line 34, the operation control source electrode S5 is connected to the driving voltage line 26, and the operation control drain electrode D5 is connected to both the driving source electrode S1 and the switching drain electrode D2. The operation control source electrode S5 corresponds to an operation control source region of the operation control semiconductor layer A5, and the operation control drain electrode D5 corresponds to an operation control drain region of the operation control semiconductor layer A5. The operation control source region the operation control drain region of the operation control semiconductor layer A5 are doped with impurity.

The emission control TFT T6 includes an emission control semiconductor layer A6, an emission control gate electrode G6, an emission control source electrode S6, and an emission control drain electrode D6. The emission control gate electrode G6 is connected to the emission control line 34, the emission control source electrode S6 is connected to the driving drain electrode D1 and the compensation source electrode S3, and the emission control drain electrode D6 is electrically connected to the anode electrode of the organic light-emitting diode OLED. The operation control TFT T5 and the emission control TFT T6 are simultaneously turned on in response to the emission control signal En transferred via the emission control line 34, and in combination with TFT T1 the first power ELVDD is supplied to the organic light-emitting diode OLED so that the driving current Id flows through the organic light-emitting diode OLED. The emission control source electrode S6 corresponds to an emission control source region of the emission control semiconductor layer A6 and the emission control drain electrode D6 corresponds to an emission control drain region of the emission control semiconductor layer A6 are doped with impurity, and the emission control drain electrode D6 is connected to the anode electrode by using the connection member.

The first terminal Cst1 of the storage capacitor Cst is connected to the driving gate electrode G1 of the driving TFT T1, the compensation drain electrode D3 of the compensation TFT T3, and the initialization drain electrode D4 of the initialization TFT T4, via connection nodes. The first terminal Cst1 is an island shaped floating electrode formed from the same material layer as the previous scan line 14, the emission control line 34, the initialization gate electrode G4, the operation control gate electrode G5, and the emission control gate electrode G6.

The second terminal Cst2 of the storage capacitor Cst is connected to the driving voltage line 26. The second terminal Cst2 is an island shaped floating electrode completely overlapping with the first terminal Cst1. The second terminal Cst2 is formed from the same material layer as the initialization voltage line 20, the scan line 24, the driving gate electrode G1, the switching gate electrode G2, and the compensation gate electrode G3.

The driving TFT T1, the switching TFT T2, and the compensation TFT T3 each include a gate insulating layer formed of two insulating layers lying between a semiconductor layer and a gate electrode, whereas each of the initialization TFT T4, the operation control TFT T5, and the emission control TFT T6 include a gate insulating layer formed of only one insulating layer. A gate insulating layer of each of the driving TFT T1, the switching TFT T2, and the compensation TFT T3 is thicker than a gate insulating layer of the initialization TFT T4, the operation control TFT T5, and the emission control TFT T6.

A cathode electrode of the organic light-emitting diode OLED is connected to a second power ELVSS. Accordingly, the organic light-emitting diode OLED emits light and displays an image when receiving the driving current Id from the driving TFT T1.

Figure 7:
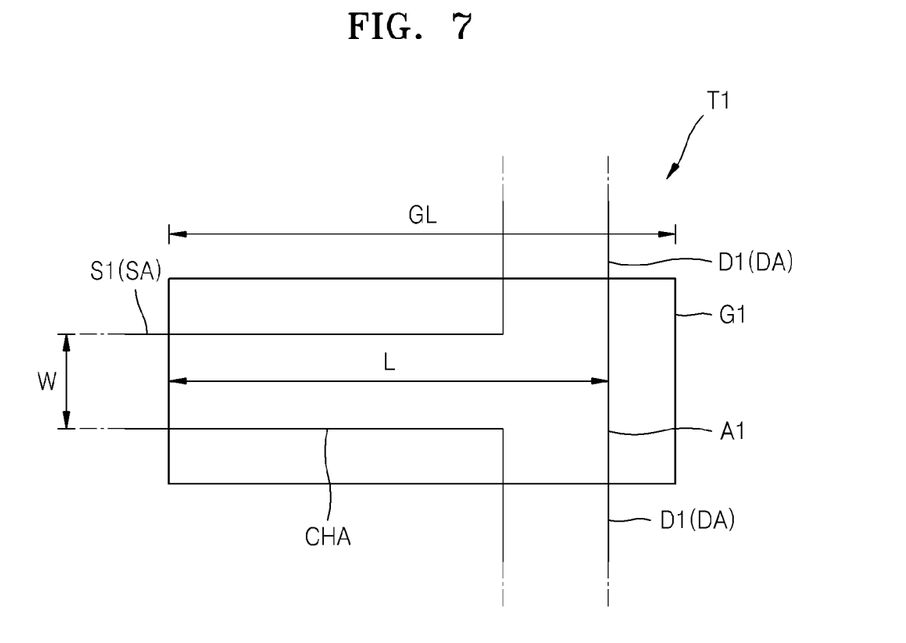
FIG. 7 illustrates a portion of the driving TFT of FIG. 6.

FIG. 7 illustrates a portion of the driving TFT of FIG. 6.

Referring to FIG. 7, the driving TFT T1 includes the driving semiconductor layer A1, the driving gate electrode G1, the driving source electrode S1, and the driving drain electrode D1.

The driving semiconductor layer A1 may be formed of polysilicon and may include a source region SA, a drain region DA, and a channel region CHA between the source region SA and the drain region DA, wherein the source region SA and the drain region DA are doped with impurity. The source region SA of the driving semiconductor layer A1 corresponds to the driving source electrode S1, and the drain region DA of the driving semiconductor layer A1 corresponds to the driving drain electrode D1.

A channel length L and a channel width W of the driving TFT T1 are defined by the channel region CHA wherein the driving semiconductor layer A1 overlaps with the driving gate electrode G1. As described with reference to FIG. 4, a size of the driving TFT T1 is decided by the channel length L and the channel width W. Again, as the channel length L or the channel width W increases, the size of the driving TFT T1 increases.

In the present embodiment, the channel length L is adjusted by adjusting a length GL of the driving gate electrode G1 of the driving TFT T1. As the length GL of the driving gate electrode G1 is decreased, an overlapped region between the driving semiconductor layer A1 and the driving gate electrode G1 is decreased, resulting in a decrease in the channel length L. If the channel width W of the driving TFT T1 is constant and the channel length L is decreased, a driving current Ioled flowing in the organic light-emitting diode OLED is increased (as calculated by using Equation 1), and brightness of light emitted from the organic light-emitting diode OLED is increased. On the other hand, if the channel width W of the driving TFT T1 is constant and the channel length L is increased, the driving current Ioled flowing in the organic light-emitting diode OLED is decreased, and the brightness of the light emitted from the organic light-emitting diode OLED is decreased.

In the present embodiment regarding the driving TFT T1, the channel length L is adjusted by adjusting the length GL of the driving gate electrode G1, so that the size of the driving TFT T1 may be adjusted regardless of a shape of the driving semiconductor layer A1. By adjusting the size of the driving TFT T1, it is possible to control brightness of a pixel.

Figure 8:
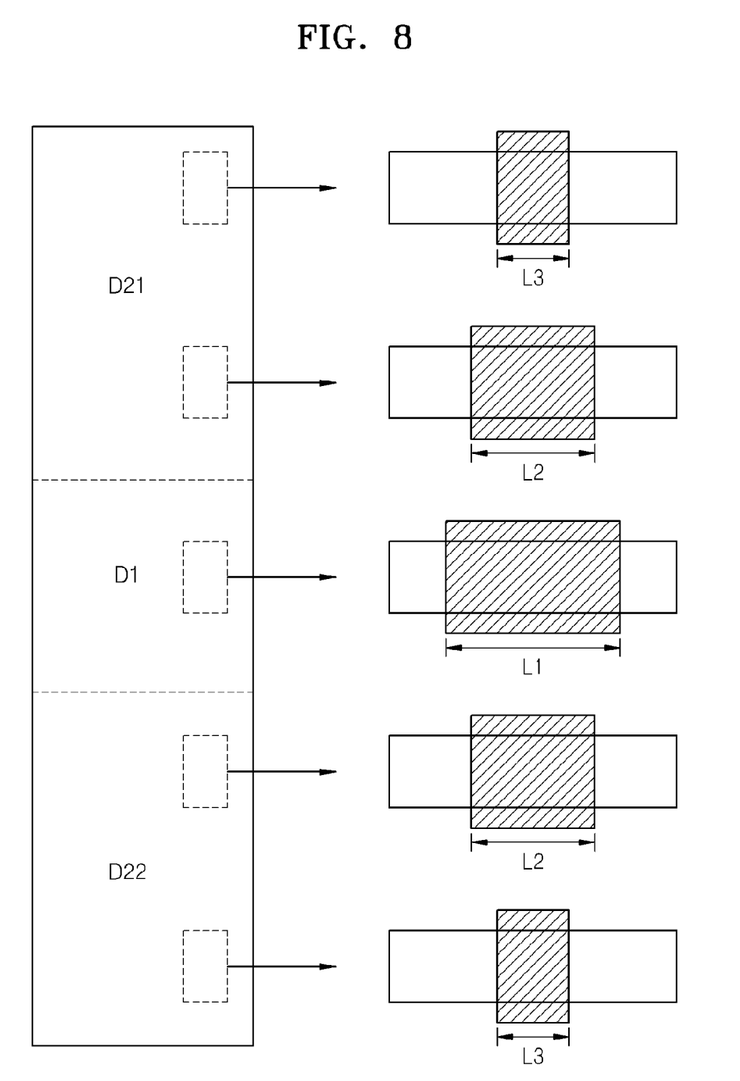
FIG. 8 illustrates an example in which sizes of driving TFTs are adjusted to compensate for pixel brightness according to pixel positions on the flexible display panel according to an embodiment of the present invention.

FIG. 8 illustrates an example in which sizes of driving TFTs are adjusted to compensate for pixel brightness according to pixel positions on the flexible display panel according to an embodiment of the present invention.

Due to flexion of the flexible display panel 10, a brightness difference may occur in one direction with respect to boundaries between a first display region D1 and second display regions D21 and D22. In the present embodiment, pixel brightness is increased or decreased with respect to a flexion start position of the flexible display panel 10. In response, pixel brightness is decreased or increased accordingly by adjusting driving TFT sizes of the pixels according to pixel positions, as each driving TFT drives a separate pixel. A size adjustment ratio of the driving TFTs is determined in consideration of the flexion level, design characteristics and image characteristics of the flexible display panel 10. In determining size adjustment ratio of the driving TFTs, image characteristics such as brightness, a white color balance, and the like are statistically collected according to pixel positions on the flexible display panel 10. The size adjustment ratio of each of the driving TFTs is then respectively adjusted according to pixel, using the statistically collected image characteristics.

The example of FIG. 8 corresponds to a case in which the brightness of the second display regions D21 and D22, compared to the first display region D1, decreases toward the outer sides. The decrease in brightness begins at the boundaries between the first display region D1 and the second display regions D21 and D22. By increasing the brightness of the second display regions D21 and D22 toward the outer sides, the brightness difference between the first display region D1 and the second display regions D21 and D22 may be reduced.

Beginning at the boundaries between the first display region D1 and the second display regions D21 and D22, sizes of driving TFTs of pixels are gradually decreased toward the outer sides by a predetermined ratio. For example, referring to FIG. 8, the channel length L is decreased toward the outer sides so that L1>L2>L3. As a result, the driving current Ioled flowing in each organic light-emitting diode OLED of each pixel, and thus pixel brightness, is increased toward the outer sides.

For simplicity, FIG. 8 only illustrates a driving gate electrode and a semiconductor layer of a driving TFT of each pixel. In the example of FIG. 8, pixel brightness is gradually decreased toward the outer sides starting from the boundaries between the first display region D1 and the second display regions D21 and D22. However, aspects of the present invention are not limited thereto, and various changes are possible, e.g., a size of a driving TFT of a pixel may be adjusted in a region that requires brightness compensation based on statistical data according to a characteristic of the flexible display panel 10. In another example, the brightness of the second display regions D21 and D22, compared to the first display region D1, increases toward the outer sides. The increase in brightness begins at the boundaries between the first display region D1 and the second display regions D21 and D22. The pixels may be designed so that the channel length L of the driving TFT of each of the pixels is gradually increased by a predetermined ratio, wherein the gradual increase begins at the boundaries between the first display region D1 and the second display regions D21 and D22 and ends at the outer sides. As a result, the driving current Ioled flowing in the organic light-emitting diode OLED of each pixel, and thus pixel brightness, is decreased toward the outer sides. The difference in brightness between the first display region D1 and the second display regions D21 and D22 is thus reduced.

FIGS. 9A, 9B, 9C and 10 illustrate examples in which sizes of driving TFTs are adjusted to compensate for color impression according to pixel positioning on the flexible display panel of FIG. 1 according to embodiments of the present invention.

In the flexible display panel 10, a red pixel R having a red emission color, a green pixel G having a green emission color, and a blue pixel B having a blue emission color are adjacent to each other. Each of the red, green, and blue pixels R, G, and B, respectively, includes a plurality of TFTs inclusive of a driving TFT, a storage capacitor, and an organic light-emitting diode as shown in FIG. 2 or 5.

Due to flexion of the flexible display panel 10, a color impression difference may occur in one direction with respect to a boundary between a first display region D1 and second display regions D21 and D22.

In the present embodiment, brightness of a particular colored pixel is increased or decreased with respect to a flexion start portion of the flexible display panel 10, resulting in color impression differences. In response, the brightness of color pixels is decreased or increased by adjusting sizes of driving TFTs of those color pixels according to pixel positions. When a size of a driving TFT of at least one of the red, green, and blue pixels R, G, and B, respectively, is adjusted, a driving current that flows in the organic light-emitting diode in that color pixel is also adjusted, and thus brightness and a white balance of the flexible display panel 10 may be adjusted. A size adjustment ratio of the driving TFT of each pixel may be determined in consideration of the flexion level, the design characteristics and the image characteristics of the flexible display panel 10. In determining the size adjustment ratio of the driving TFTs, image characteristics according to particular-colored pixel positions on the flexible display panel 10, such as brightness, white color balance, and the like are statistically collected. The size adjustment ratio of each of the driving TFTs may be adjusted according to pixels by using the statistically collected image characteristics.

Figure 9A:
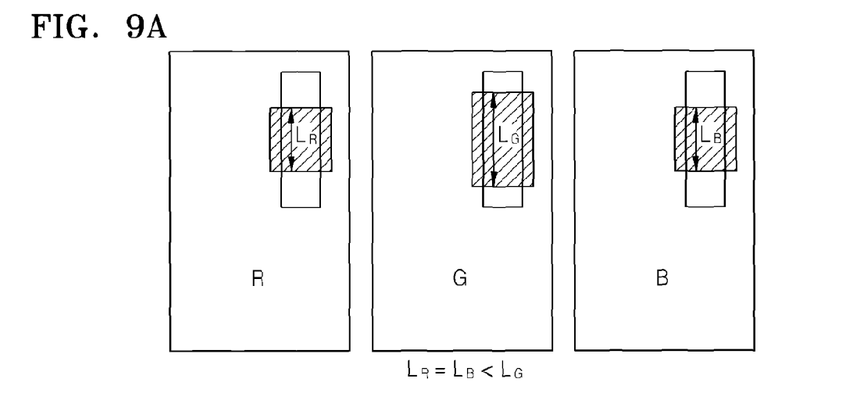
FIGS. 9A, 9B, 9C and 10 illustrate examples in which sizes of driving TFTs are adjusted to compensate for color impression according to positions of color pixels on the flexible display panel according to embodiments of the present invention.

Referring to FIG. 9A, when a high percentage of green color is present in an image displayed on the flexible display panel 10, brightness of the green pixel G is decreased to a level lower than brightness levels of the red and blue pixels R and B, respectively. In order for this decrease to occur, a channel length $L_G$ of a driving TFT of the green pixel G is increased so as to be greater than a channel length $L_R$ of the red pixel R and a channel length $L_B$ of the blue pixel B ($L_R=L_B<L_G$). Accordingly, a high percentage of the green color is decreased so that a white color balance may be achieved.

Figure 9B:
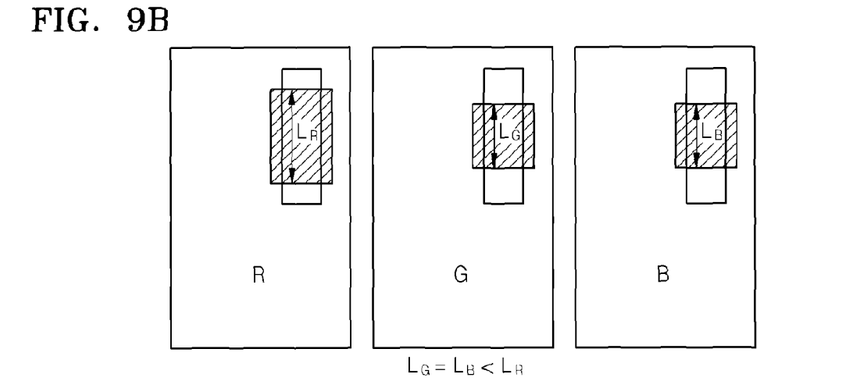

Referring to FIG. 9B, when a high percentage of red color is present in an image displayed on the flexible display panel 10, brightness of the red pixel R is decreased to a level lower than brightness levels of the green and blue pixels G and B, respectively. In order for this decrease to occur, a channel length $L_R$ of a driving TFT of the red pixel R is increased so as to be greater than a channel length $L_G$ of the green pixel G and a channel length $L_B$ of the blue pixel B ($L_G=L_B<L_R$). Accordingly, the high percentage of the red color is decreased so that a white color balance may be achieved.

Figure 9C:
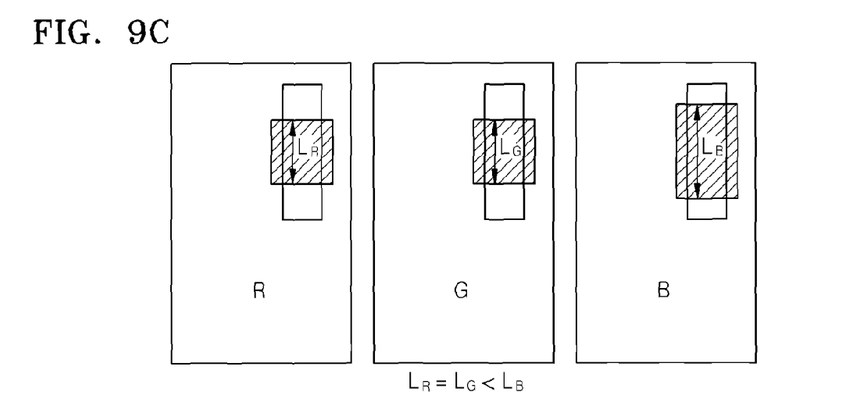

Referring to FIG. 9C, when a high percentage of blue color is present in an image displayed on the flexible display panel 10, brightness of the blue pixel B is decreased to a level lower than brightness levels of the red and green pixels R and G, respectively. In order for this decrease to occur, a channel length $L_B$ of a driving TFT of the blue pixel B is increased so as to be greater than a channel length $L_R$ of a driving TFT of the red pixel R and a channel length $L_G$ of the green pixel G ($L_R=L_G<L_B$). Accordingly, the high percentage of the blue color is decreased so that a white color balance may be achieved.

Figure 10:
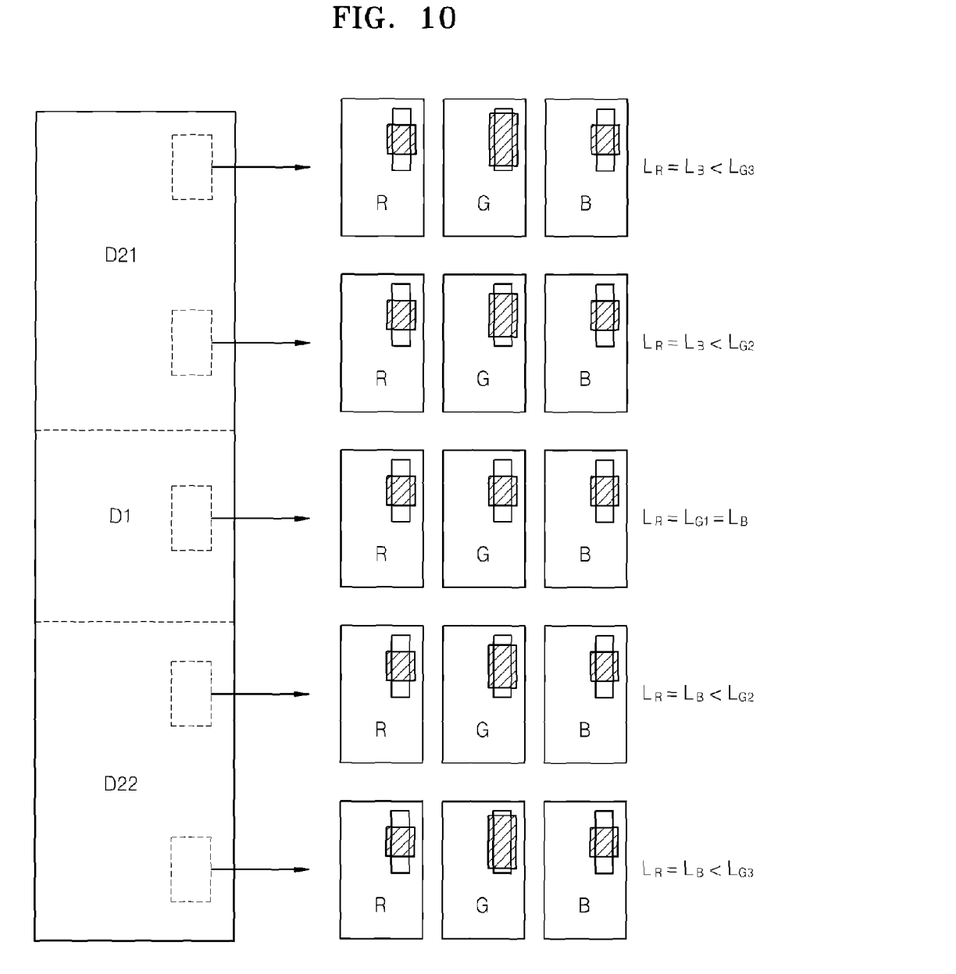

In the embodiment of FIG. 10, when a green color percentage in an image increases in a direction from boundaries between a first display region D1 and second display regions D21 and D22 toward outer sides, a size of a driving TFT for each of a plurality of green pixels G is changed so as to gradually decrease the brightness of the green pixel G toward the outer sides.

Referring to FIG. 10, sizes of driving TFTs of red, green, and blue pixels R, G, and B, respectively, of the first display region D1 are evenly formed, and thus the red, green, and blue pixels R, G, and B, respectively, emit the same brightness. In the second display regions D21 and D22, which are curved, the green color percentage in the image increases in the direction from the boundaries between the first display region D1 and the second display regions D21 and D22 toward the outer sides. The brightness of the green pixel G is gradually decreased in the same direction so that a white color balance of the flexible display panel 10 may be achieved. For example, the red, green, and blue pixels R, G, and B, respectively, are disposed in such a manner that the sizes of the driving TFTs are gradually increased from the boundaries between the first display region D1 and the second display regions D21 and D22 toward the outer sides by a predetermined ratio. Since a length GL of a driving gate electrode of the driving TFT of the green pixel G is gradually increased, a channel length L overlapping with the driving gate electrode is gradually increased ($L_{G1}<L_{G2}<L_{G3}$), and the driving current Ioled that flows in the organic light-emitting diode OLED is decreased so that brightness of the green pixel G may be gradually decreased in the second display regions D21 and D22 toward the outer sides. Accordingly, a green color percentage in the image of the second display regions D21 and D22 may be decreased toward the outer sides, and thus the white balance of the flexible display panel 10 may be achieved.

For simplicity, FIGS. 9A, 9B, 9C and 10 only illustrate a driving gate electrode and a semiconductor layer of a driving TFT of each pixel. In the embodiment of FIG. 10, the white balance is not balanced because the green color percentage in the second display regions D21 and D22 is increased toward the outer sides starting from the boundaries between the first display region D1 and the second display regions D21 and D22. However, aspects of the present invention are not limited thereto, and various changes are possible. For example, color impressions according to particular-color pixel positions on the flexible display panel 10 which vary due to the flexion level of the flexible display panel 10 are statistically collected, and the size of a driving TFT of a particular-color pixel may be changed in response to the statistically collected color impressions. For example, when a yellow color percentage in an image of the second display regions D21 and D22 increases toward the outer sides, the channel lengths L of the driving TFTs of the red and green pixels R and G, respectively, may be gradually increased by a predetermined ratio from the boundaries between the first display region D1 and the second display regions D21 and D22 toward the outer sides. By doing so, the driving current Ioled that flows in the organic light-emitting diodes OLEDs of the red and green pixels R and G, respectively, may be decreased so that brightness of the red and green pixels R and G, respectively, may be decreased, and thus the yellow color percentage in the image may be decreased. Accordingly, the white balance of the flexible display panel 10 may be achieved.

In the one or more embodiments of the present invention, the size of the driving TFT may be adjusted to compensate for brightness or a color impression of the flexible display panel. However, aspects of the present invention are not limited thereto and sizes of driving TFTs according to positions on the flexible display panel may be adjusted in consideration of compensation for both brightness and color impression. In the one or more embodiments of the present invention, a brightness difference and/or a color impression difference in an entire region of the second display region are compensated for. However, aspects of the present invention are not limited thereto, and the second display region may be divided into a plurality of regions according to a panel design, wherein compensation may be performed in at least one of the plurality of regions or performed differently in each of the plurality of regions.

While one or more embodiments are related to the driving TFTs of the pixels shown in FIGS. 2 and 5, aspects of the present invention are not limited thereto, and thus one or more embodiments of the present invention may also be applied to a flexible display panel including a plurality of pixels, each of the plurality of pixels including a driving TFT connected to an emission device so as to supply a driving current thereto.

In the one or more embodiments of the present invention, driving TFTs of pixels formed in a flexed region of a panel are sized differently from each other in order to correct non-uniformity of image characteristics due to flexion of the flexible display panel.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A flexible display panel comprising:
   a first display region that is flat,
   second display regions located at both sides of the first display region and curved by a predetermined angle,
   a plurality of pixels formed in the first display region, and
   a plurality of pixels formed in the second display regions;
   each of the plurality of pixels formed in the first display region and the second display regions comprising a driving thin-film transistor (TFT) connected to a light-emitting diode, the driving TFT having a driving gate electrode and supplying a driving current to the light-emitting diode, and
   areal sizes of top surfaces of the driving gate electrodes of the driving TFTs of the pixels varying gradually, and each of the areal sizes varying for each of the plurality of pixels formed in at least a part of the second display regions, so that driving currents supplied by the driving TFTs in the second display regions vary in one direction with respect to boundaries between the first display region and each of the second display regions.

2. The flexible display panel of claim 1, the areal size of the driving TFT varying with a length of a channel region in which the driving gate electrode and a driving semiconductor layer overlap with each other by adjusting a length of the driving gate electrode.

3. The flexible display panel of claim 2, areal sizes of driving TFTs of pixels that are formed in a first direction gradually decreasing so that brightness is increased in a first direction in which a visual distance and a viewing angle are increased with respect to the boundaries between the first display region and each of the second display regions.

4. The flexible display panel of claim 2, areal sizes of driving TFTs of pixels that are formed in a first direction gradually increasing so that brightness is decreased in the first direction in which a visual distance and a viewing angle are increased with respect to the boundaries between the first display region and each of the second display regions.

5. The flexible display panel of claim 2, areal sizes of driving TFTs of at least one color pixel related to a particular color and formed in a first direction gradually increasing so that brightness of the color is decreased in a first direction in which a display ratio of the color is increased with respect to the boundaries between the first display region and each of the second display regions.

6. The flexible display panel of claim 5, areal sizes of driving TFTs of color pixels in the first display region being equal to each other.

7. The flexible display panel of claim 6, said at least one color pixel comprising a red pixel, a green pixel, and a blue pixel.

8. The flexible display panel of claim 1, the driving TFT comprising:
   a driving semiconductor layer;
   the driving gate electrode covering a channel region of the driving semiconductor layer;
   a first insulating layer disposed on the driving semiconductor layer;

a second insulating layer disposed on a first electrode of a storage capacitor formed on the first insulating layer; and a driving source electrode and a driving drain electrode that correspond to a driving source region and a driving drain region, respectively, of the driving semiconductor layer, the driving source electrode and the driving drain electrode being doped with impurity.

9. The flexible display panel of claim 1, each of the second display regions being flexed toward a first side on which an image is realized.

10. The flexible display panel of claim 1, each of the second display regions being flexed toward a second side opposite to a first side on which an image is realized.

11. A flexible display panel, comprising:
a first display region that is flat and in which a first plurality of pixels, each comprising a light-emitting diode and a first driving thin-film transistor (TFT), are formed, the first driving TFT being connected to, and supplying a driving current to, the light-emitting diode; and
second display regions that are curved at both sides of the first display region by a predetermined angle, and in which a second plurality of pixels, each comprising a light-emitting diode and a second driving TFT, are formed;
for each of the second plurality of pixels formed in the second display regions, the second driving TFT is connected to, and supplies a driving current to, the light-emitting diode;
the second plurality of pixels being formed in predetermined regions of each of the second display regions; and
for each of the second plurality of pixels formed in the predetermined regions, areal size variations of driving gate electrodes of the second driving TFTs being gradual and based on brightness changes in the predetermined regions with respect to boundaries with the first display region.

12. The flexible display panel of claim 11, the areal size of the second driving TFT varying with a length of a channel region in which the driving gate electrode and a driving semiconductor layer overlap with each other by adjusting a length of the driving gate electrode.

13. The flexible display panel of claim 12, areal sizes of a plurality of the second driving TFTs of pixels that are formed in a first direction being gradually decreased so that brightness is increased in the first direction, increasing a visual distance and a viewing angle in the predetermined region.

14. The flexible display panel of claim 12, areal sizes of a plurality of the second driving TFTs of pixels that are formed in a first direction being gradually increased so that brightness is decreased in the first direction, increasing a visual distance and a viewing angle in the predetermined region.

15. A flexible display panel, comprising:
a first display region that is flat and in which a first plurality of pixels, each comprising a light-emitting diode and a first driving thin-film transistor (TFT), are formed, the first driving TFT being connected to, and supplying a driving current to, the light-emitting diode; and
second display regions that are curved at both sides of the first display region by a predetermined angle, and in which a second plurality of pixels, each comprising a light-emitting diode and a second driving TFT, are formed;
for each of the second plurality of pixels formed in the second display regions, the second driving TFT is connected to, and supplies a driving current to, the light-emitting diode; and
for color pixels formed in predetermined regions of each of the second display regions, areal size variations of driving gate electrodes of the second driving TFTs being gradual and based on corresponding color impression variations in the predetermined regions with respect to boundaries with the first display region.

16. The flexible display panel of claim 15, the areal size of the second driving TFT varying with a length of a channel region in which the driving gate electrode and a driving semiconductor layer overlap with each other by adjusting a length of the driving gate electrode.

17. The flexible display panel of claim 15, areal sizes of a plurality of the second driving TFTs of at least one color pixel related to a particular color and formed in a first direction being gradually increased so that brightness of the particular color is decreased in the first direction, increasing a display ratio of the particular color in the predetermined region.

18. The flexible display panel of claim 17, areal sizes of first driving TFTs of different color pixels formed in the first display region being equal to each other.

19. The flexible display panel of claim 15, the color pixels comprising a red pixel, a green pixel, and a blue pixel.

20. The flexible display panel of claim 17, the particular color being green color.

* * * * *